(12) United States Patent
Akeboshi et al.

(10) Patent No.: US 8,120,367 B2
(45) Date of Patent: Feb. 21, 2012

(54) ANALOG INPUT DEVICE

(75) Inventors: Yoshihiro Akeboshi, Tokyo (JP); Seiichi Saito, Tokyo (JP); Tetsuya Nagakawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 506 days.

(21) Appl. No.: 12/438,366

(22) PCT Filed: Dec. 14, 2006

(86) PCT No.: PCT/JP2006/324925
§ 371 (c)(1),
(2), (4) Date: Feb. 23, 2009

(87) PCT Pub. No.: WO2008/072329
PCT Pub. Date: Jun. 19, 2008

(65) Prior Publication Data
US 2009/0257260 A1 Oct. 15, 2009

(51) Int. Cl.
*G01R 31/10* (2006.01)
(52) U.S. Cl. .......... 324/500; 327/407; 327/524
(58) Field of Classification Search .......... 324/500; 327/404, 407, 524
See application file for complete search history.

(56) References Cited

U.S. PATENT DOCUMENTS 3,281,539 A * 10/1966 Dunlap et al. ............... 340/2.24
4,213,016 A * 7/1980 Brockmann et al. ............ 379/22

FOREIGN PATENT DOCUMENTS

| JP | 63 113622 | 5/1988 |
| JP | 2 83465 | 3/1990 |
| JP | 04-156270 | 5/1992 |
| JP | 7 244561 | 9/1995 |
| JP | 07244561 A * | 9/1995 |
| JP | 2000 28670 | 1/2000 |

* cited by examiner

*Primary Examiner* — Huy Q Phan
*Assistant Examiner* — Son Le
(74) *Attorney, Agent, or Firm* — Oblon, Spivak, McClelland, Maier & Neustadt, L.L.P.

(57) ABSTRACT

An analog input device including a scanning circuit including a first insulation transformer insulating an analog signal inputted from a thermocouple, a power supply section charging a test voltage used for disconnection detection of the thermocouple, a second insulation transformer in which the scanning circuit and the power supply section are connected in parallel, and a control circuit for outputting a pulse signal to be inputted to the second insulation transformer. The second insulation transformer insulates and transfers a drive pulse for switching the scanning circuit and a power supply pulse for feeding power to the power supply section. The control circuit carries out a timing control so that the drive pulse and the power supply pulse are not outputted at the same time. Accordingly, an insulation transformer for application of a test voltage is not required, and thus the total number of the components is reduced to a great extent and reductions in costs and size thereof are realized.

8 Claims, 6 Drawing Sheets

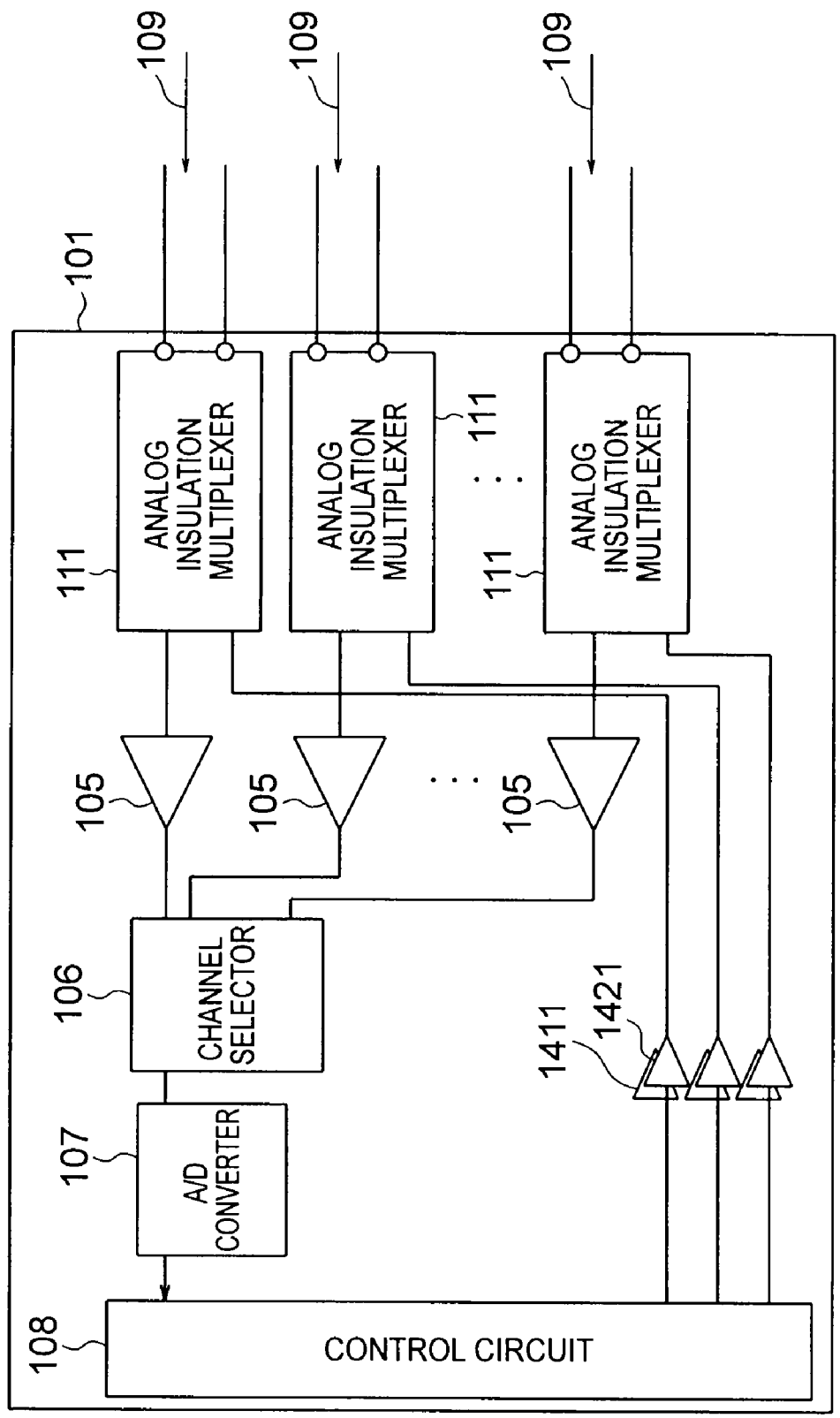

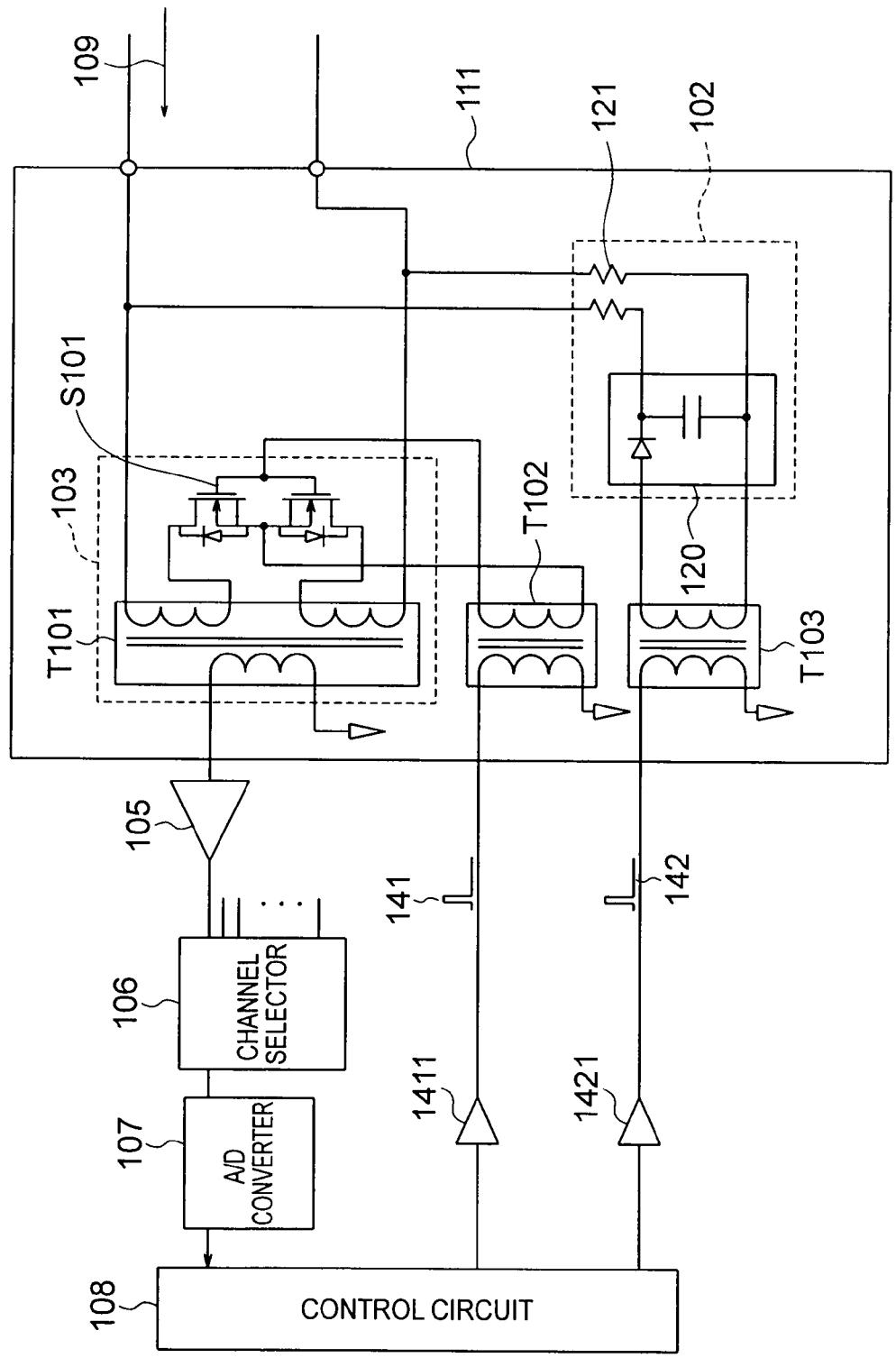

ANALOG INPUT DEVICE

TECHNICAL FIELD

The present invention relates to an analog input device, and more particularly, to an analog input device for collecting analog signals outputted from an external device such as a sensor through insulation means.

BACKGROUND ART

There have conventionally been used analog signal input devices that adopt an inexpensive circuit system, in which an insulation transformer or the like is employed as insulation means to collect analog signals outputted from an external device such as a sensor including a thermocouple. Installation environments of the thermocouple or the like are generally inadequate, so disconnection detection means for generating a test voltage for detecting a disconnection and a contact failure caused in the external device such as the thermocouple is mounted to those analog input devices.

As the conventional analog input devices, for example, there are disclosed ones which include a power supply section for generating a test voltage, and employs a method in which a signal is inputted through an insulation transformer from a control circuit and the test voltage generated thereby is applied to a thermocouple to detect a disconnection state (for example, Patent Documents 1 and 2).

Configuration examples of this kind of conventional analog input device are shown in FIGS. 5 and 6. FIG. 5 is a configuration diagram showing a conventional analog input device 101 mounted with a plurality of analog insulation multiplexers 111. As shown in FIG. 5, the analog input device 101 includes the plurality of analog insulation multiplexers 111 for insulating and collecting analog signals 109, a plurality of amplifiers 105 connected to the respective analog insulation multiplexers 111, a channel selector 106 which is connected to the amplifiers 105 and selects an input channel, an A/D converter 107 connected to the channel selector 106, and a control circuit 108 connected to the A/D converter 107. Further, each analog insulation multiplexer 111 is connected to a single gate element 1411 and a single gate element 1421. Note that each of the gate elements 1411 and 1421 is connected between the control circuit 108 and the analog insulation multiplexers 111.

FIG. 6 is a configuration diagram showing an internal circuit of the conventional analog insulation multiplexer 111 shown in FIG. 5. For simplification, in FIG. 6, the analog insulation multiplexer 111, the amplifier 105, and the gate elements 1411 and 1421 are shown one each only. In the analog insulation multiplexer 111, a power supply section 102 and a scanning circuit 103 are provided. Further, in the analog insulation multiplexer 111, a second insulation transformer T102 connected between the control circuit 108 and the scanning circuit 103 and a third insulation transformer T103 connected between the control circuit 108 and the power supply section 102 are provided.

The scanning circuit 103 for insulating and collecting the analog signals 109 outputted from the sensor such as the thermocouple includes a first insulation transformer T101 and a switching element S101. The analog signal 109 is insulated by the first insulation transformer T101 and inputted to the internal circuit of the analog input device 101. Further, a drive pulse 141 for performing an ON/OFF control of the switching element S101 is inputted to the second insulation transformer T102 from the control circuit 108 through the gate element 1411 and insulated by the second insulation transformer T102 to be transmitted to the switching element S101.

On the other hand, the power supply section 102 for detecting a disconnection and a contact failure of the sensor such as the thermocouple is connected to a secondary side of a third insulation transformer T103. A power supply pulse 142 inputted from the control circuit 108 through the gate element 1421 is applied to a primary side of the third insulation transformer T103, whereby a smoothing circuit 120 provided in the power supply section 102 is charged with a test voltage used for detecting a disconnection or the like. The test voltage is applied to an interface of the sensor such as the thermocouple through a high-resistor 121 provided in the power supply section 102. Note that, although omitted in FIGS. 5 and 6, voltage measurement means is provided. The voltage measurement means detects an abnormality such as a disconnection by detecting a voltage led to an output terminal of the sensor such as the thermocouple by the using the test voltage when the test voltage is applied, and comparing the voltage with a preset reference voltage, or the like.

Patent Document 1: JP 63-113622 A
Patent Document 2: JP 07-244561 A

DISCLOSURE OF THE INVENTION

Problems to be solved by the Invention

However, the above-mentioned conventional analog input device has the following problems. To insulate and apply a test voltage to the power supply section 102, the third insulation transformer T103 is additionally required. In particular, for the analog input device mounted with the multichannel analog insulation multiplexers 111, the third insulation transformer T103 causes an increase in the number of components. In other words, there arise problems in that costs and areas to which the components are mounted are increased, thereby being impossible to mount all the components onto a single printed board.

The present invention has been made to solve the above-mentioned problems, and it is therefor an object of the present invention to attain an analog input device that dose not require an insulation transformer for application of a test voltage, thereby enabling a significant decrease in the number of components as a whole, and reductions in costs and size thereof.

Means for solving the Problems

According to the present invention, there is provided an analog input device to which an analog signal outputted from an external device is inputted, for collecting the analog signal, including: a scanning circuit which includes a first insulation transformer for insulating the inputted analog signal; a power supply section for charging a test voltage used for detecting a disconnection caused in the external device; a second insulation transformer in which the scanning circuit and the power supply section are connected with each other in parallel; and control means for outputting a pulse signal to be inputted to the second insulation transformer, in which: the second insulation transformer receives a drive pulse for switching the scanning circuit from the control means and insulates the drive pulse to send the drive pulse to the scanning circuit, and also receives a power supply pulse for feeding power to the power supply section from the control means and insulates the power supply pulse to send the power supply pulse to the power supply section; and the control means performs a timing control so that the drive pulse and the power supply pulse are not outputted at the same time, and outputs the drive pulse and the power supply pulse therefrom.

EFFECTS OF THE INVENTION

According to the present invention, the analog input device to which an analog signal outputted from an external device is inputted, for collecting the analog signal, including: the scanning circuit which includes the first insulation transformer for insulating the inputted analog signal; the power supply section for charging a test voltage used for detecting a disconnection caused in the external device; the second insulation transformer in which the scanning circuit and the power supply section are connected with each other in parallel; and the control means for outputting a pulse signal to be inputted to the second insulation transformer, and in the analog input device: the second insulation transformer receives a drive pulse for switching the scanning circuit from the control means and insulates the drive pulse to send the drive pulse to the scanning circuit, and also receives a power supply pulse for feeding power to the power supply section from the control means and insulates the power supply pulse to send the power supply pulse to the power supply section; and the control means performs a timing control so that the drive pulse and the power supply pulse are not outputted at the same time, and outputs the drive pulse and the power supply pulse therefrom. Accordingly, an insulation transformer for application of a test voltage is not required, and thus the total number of the components is reduced to a great extent and reductions in costs and size thereof are realized.

BRIEF DESCRIPTION OF THE DRAWINGS

FIG. 5 is a configuration diagram of a conventional analog input device.

FIG. 6 is a circuit configuration diagram of a conventional analog insulation multiplexer.

BEST MODE FOR CARRYING OUT THE INVENTION

Hereinafter, descriptions will be made of preferred embodiments of the analog input device according to the present invention with reference to the drawings.

First Embodiment

Figure 1:
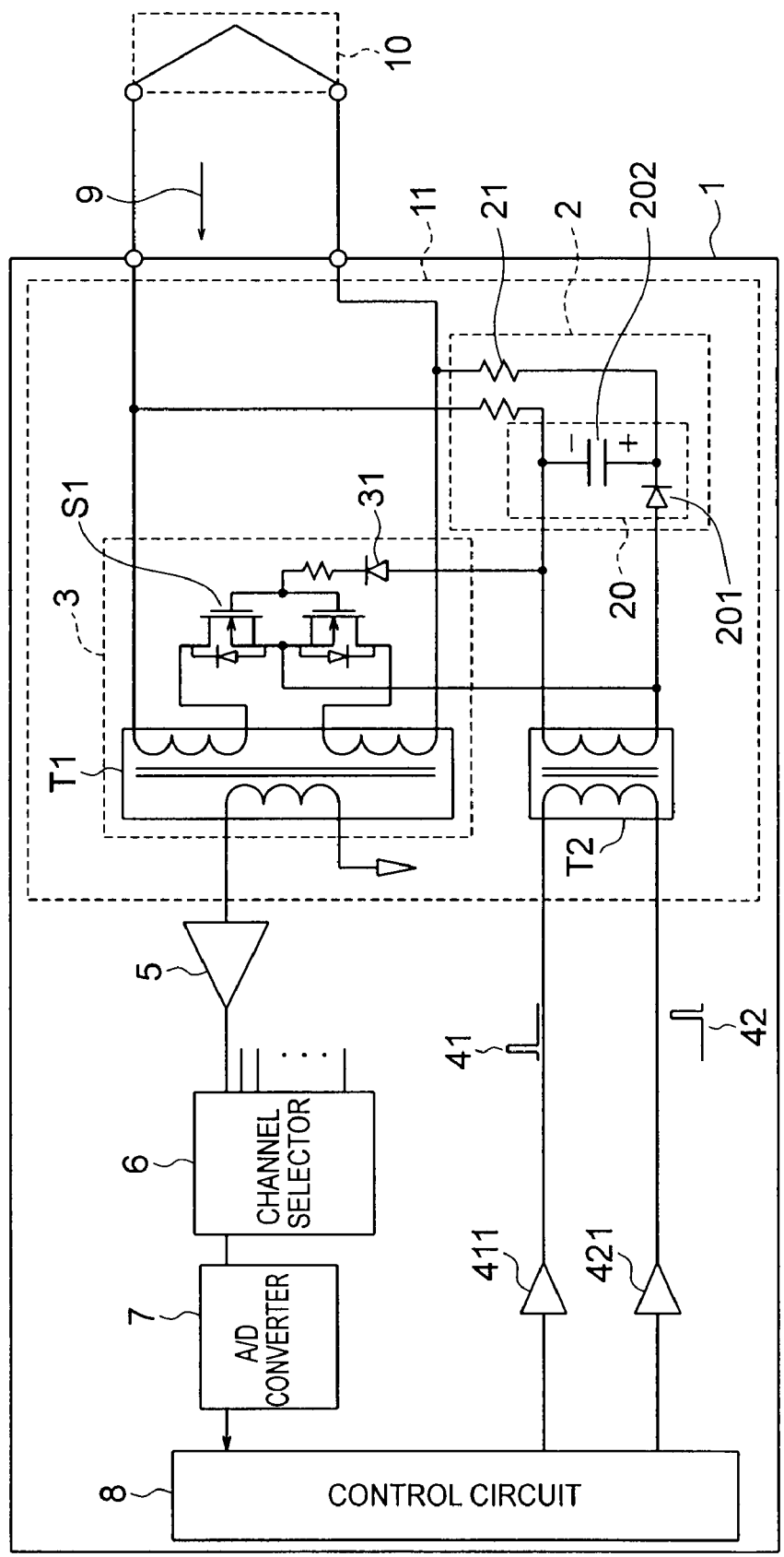
FIG. 1 is a configuration diagram showing a configuration of an analog input device according to a first embodiment of the present invention.

FIG. 1 is a configuration diagram of an analog input device 1 according to a first embodiment of the present invention. As shown in FIG. 1, the analog input device 1 includes a scanning circuit 3 for collecting an analog signal 9 outputted from a sensor such as a thermocouple 10, an amplifier 5 connected to the scanning circuit 3, a channel selector 6 connected to the amplifier 5, an A/D converter 7 connected to the channel selector 6, and a control circuit 8 connected to the A/D converter 7. The scanning circuit 3 further includes a first insulation transformer T1 for insulating the analog signal 9 outputted from the thermocouple 10, a switching element S1 for controlling a timing of scanning of an analog signal, and a rectifying element 31 that is put into a conduction state only when a drive pulse 41 is being outputted. Still further, the analog input device 1 is provided with gate elements 411 and 421, and a second insulation transformer T2. The second insulation transformer T2 insulates and transfers the drive pulse 41 and a power supply pulse 42, which are inputted through the gate elements 411 and 421 from the control circuit 8. Yet further, the analog input device 1 is provided with a power supply section 2 for generating a test voltage for detecting an abnormality such as a disconnection or a contact failure caused in the thermocouple 10. Note that the power supply section 2 includes a smoothing circuit 20 for charging a test voltage and a resistor 21 for applying the test voltage to an interface (not shown) of the thermocouple 10. The smoothing circuit 20 includes a rectifying element 201 that is put into a conduction state only when the power supply pulse 42 is being outputted, and a capacitor 202 for charging the test voltage used for the disconnection detection of the thermo couple 10. In this embodiment, the second insulation transformer T2 is connected to both of the scanning circuit 3 and the power supply section 2.

In this embodiment, an analog insulation multiplexer 11 includes the scanning circuit 3, the second insulation transformer T2, and the power supply section 2. Note that, as shown in FIG. 5 described above, in practice, the analog insulation multiplexer 11, the amplifier 105, and the gate elements 411 and 421 are each provided in a plurality of numbers corresponding to the number of channels. However, in FIG. 1, for simplification, each of those components is described as a single component.

Next, an operation of the analog input device 1 according to the first embodiment will be described. The analog signal 9 outputted from the thermocouple 10 is inputted to a primary side of the first insulation transformer T1. The amplifier 5 is connected to a secondary side of the first insulation transformer T1, and the amplified analog signal 9 is inputted to the channel selector 6. The channel selector 6 has a function of selecting one of the plurality of analog insulation multiplexers 11. The analog signal 9 outputted from the channel selector 6 is inputted to the A/D converter 7 to be converted into a digital signal. Then, the digital signal is inputted to the control circuit 8. Thus, the analog input device 1 according to the first embodiment captures the analog signal 9 obtained from the thermocouple 10, through filtering, and converts the analog signal 9 into digitized data.

The switching element S1 which is composed of an FET (field effect transistor) is connected to the primary side of the first insulation transformer T1 (analog input section). The switching element S1 is turned ON by the drive pulse 41 outputted from the control circuit 8 at the timing at which the analog signal 9 is to be scanned, so the analog signal is collected at that timing. A gate terminal and a source terminal of the switching element S1 are connected to a secondary side of the second insulation transformer T2. Further, the power supply section 2 is connected to the secondary side of the second insulation transformer T2 in parallel with the switching element S1. The drive pulse 41 is inputted to a first terminal provided on a primary side of the second insulation transformer T2 through the gate element 411 from the control circuit 8. Similarly, the power supply pulse 42 is inputted to a second terminal provided on the primary side of the second insulation transformer T2 through the gate element 421 from the control circuit 8. The drive pulse 41 is inputted through the rectifying element 31 to the switching element S1 to be used for performing an ON/OFF control of the switching element S1. The power supply pulse 42 is inputted through the rectifying element 201 to the power supply section 2 to be used for charging the capacitor 202 with the test voltage used for the disconnection detection of the power supply section 2. Note that the control circuit 8 performs a timing control so that the drive pulse 41 and the power supply pulse 42 are not outputted at the same time. In this embodiment, there has been shown the example of the configuration in which the switching element S1 is formed of the FET (field effect transistor). However, the present invention is not limited thereto. The switching element S1 may be composed of other types of transistors or other elements having a switching function. In addition, in the example of FIG. 1, one switching element S1 is shown. However, the present invention is not limited thereto. At least one switching element is minimally required, and a plurality of switching elements may be therefore provided.

The control circuit 8 issues the drive pulse 41 through the gate element 411 at a timing of input of the analog signal. The drive pulse 41 is transmitted through the second insulation transformer T2 to make a gate potential of the switching element S1 higher and put the switching element S1 into an ON state. At this time, the smoothing circuit 20 provided in the power supply section 2 includes the rectifying element 201, so a charge and discharge current to the capacitor 202 of the smoothing circuit 20 is not generated at the time of issuance of the drive pulse 41. Note that, in the first embodiment of the present invention, the rectifying element 201 includes a diode, and an anode terminal of the diode is connected to a positive terminal of the capacitor 202. With this configuration, an unnecessary leakage current is not generated, thereby making it possible to operate a function of the disconnection detection.

Further, the control circuit 8 issues the power supply pulse 42 through the gate element 421 at an arbitrary or predetermined time other than the timing of input of the analog signal. The power supply pulse 42 is transmitted through the second insulation transformer T2 to charge the capacitor 202 of the smoothing circuit 20 with a test voltage. The rectifying element 201 included in the smoothing circuit 20 has a switching function of turning into an ON state only at the timing of issuance of the power supply pulse 42. Note that, in this embodiment, the case where the diode is used as the rectifying element 201 has been described, however, the present invention is not limited thereto, and any element may be employed which turns into a conduction state only when the power supply pulse 42 is being outputted. Charging the capacitor 202 is carried out by the rectifying element 201 at the timing of issuance of the power supply pulse 42, however, a discharge current does not flow at the timing of output of the drive pulse 41. With this configuration, if the capacitor 202 of the smoothing circuit 20 is set to an appropriate capacitance value, the test voltage applied by the power supply pulse 42 can be retained. Accordingly, the test voltage for the disconnection detection can be supplied through the resistor 21 to the thermocouple 10. Here, the resistor 21 has a large resistance value of equal to or larger than several MΩ to suppress an error of an analog signal in a normal state. Note that, the rectifying element 31 is connected to the switching element S1, so no reverse potential is applied to the gate of the switching element S1 at the time of issuance of the power supply pulse 42. In the first embodiment of the present invention, the rectifying element 31 includes a diode, and an anode terminal of the diode is connected to the gate terminal of the switching element S1. With this configuration, an unnecessary leakage current is not generated, thereby making it possible to operate the function of the disconnection detection.

As described above, the detection of abnormality such as a disconnection and a contact failure of the thermocouple 10 is realized by the test voltage charged in the capacitor 202 of the power supply section 2. In a case where the thermocouple 10 is connected to the analog input device 1 in a normal manner, the analog signal 9 outputted from the thermocouple 10 is normally inputted to the analog input device 1. On the other hand, when the thermocouple 10 turns into a disconnection state, the test voltage is directly subjected to the A/D conversion and inputted to the control device 8. The test voltage (e.g. −5 V) has a potential sufficiently larger than an output level of the thermocouple 10 (e.g. approximately 100 mV), and equal to or larger than a full scale of A/D conversion. Therefore, the control device 8 does not make a false detection and surely judges abnormality such as a disconnection state of the thermocouple 10 with ease by detecting an overflow.

Figure 2:
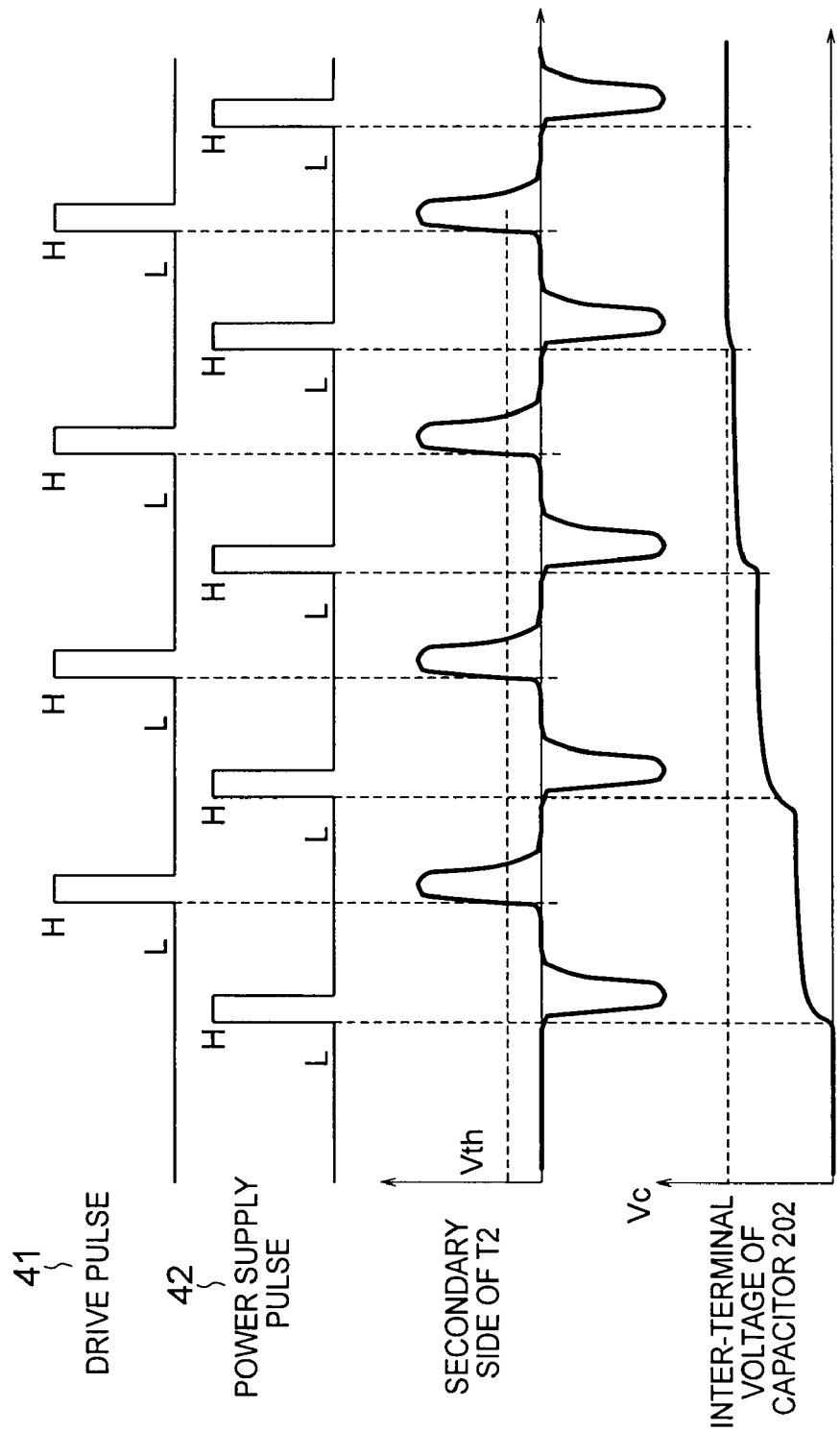
FIG. 2 is a diagram showing temporal waveforms of a second insulation transformer according to the first embodiment of the present invention.

FIG. 2 shows examples of waveforms according to the first embodiment of the present invention. In FIG. 2, there are shown four waveforms of the drive pulse 41, the power supply pulse 42, "secondary side of T2" and "inter-terminal voltage of capacitor 202." Note that, specifically, the "secondary side of T2" shows a voltage waveform which appears between the terminals provided on the secondary side of the second insulation transformer T2. The "inter-terminal voltage of capacitor 202" is the test voltage for the disconnection detection retained in the smoothing circuit 20 and shows a change of a voltage waveform at a high-potential terminal relative to a low-potential terminal of the capacitor 202.

In FIG. 2, a gate voltage of the switching element S1 exceeds a threshold Vth at the timing of output of the drive pulse 41, which causes the switching element S1 to turn into an ON state to scan the analog signal 9. At this time, no effect is caused on the inter-terminal voltage of the capacitor 202 because the rectifying element 201 is connected to the smoothing circuit 20.

On the other hand, in FIG. 2, the negative potential appears on the secondary side of the second insulation transformer T2 at the timing of output of the power supply pulse 42, and accordingly, the capacitor 202 of the smoothing circuit 20 is charged with the test voltage. Because the rectifying element 201 is provided to the smoothing circuit 20, the capacitor 202 is charged only at the timing of output of the power supply pulse 42, and charge and discharge of the capacitor 202 is not carried out at the timing of output of the drive pulse 41.

As described above, according to this embodiment, the second insulation transformer T2 has both functions which are insulation and transfer of the drive pulse 41 and the power supply pulse 42 due to the effect of the control circuit 8 and rectifying elements 31 and 201, and can functionally separate both the drive pulse 41 and the power supply pulse 42. Therefore, there is no need to add a new insulation transformer for detecting a disconnection of the thermocouple 10. Accordingly, it is possible to reduce the number of the insulation transformers, whereby the total number of the components can be reduced to a great extent. As a result, reductions in size of the circuit and in costs are realized.

Here, to insulate and transfer both the drive pulse 41 and the power supply pulse 42 by the second insulation transformer T2, as a matter of course, it is a premise that control of the switching element S1 and a function of feeding of the power supply section 2 are functionally separated.

The example of the analog insulation multiplexer 11 shown in FIG. 1 shows a connection example in which the anode terminal of the rectifying element 201 (diode) included in the power supply section 2 is connected to the positive terminal (high-potential terminal) of the capacitor 202. With this configuration, an unnecessary leakage current is not generated, thereby making it possible to operate the function of the disconnection detection.

Figure 3:
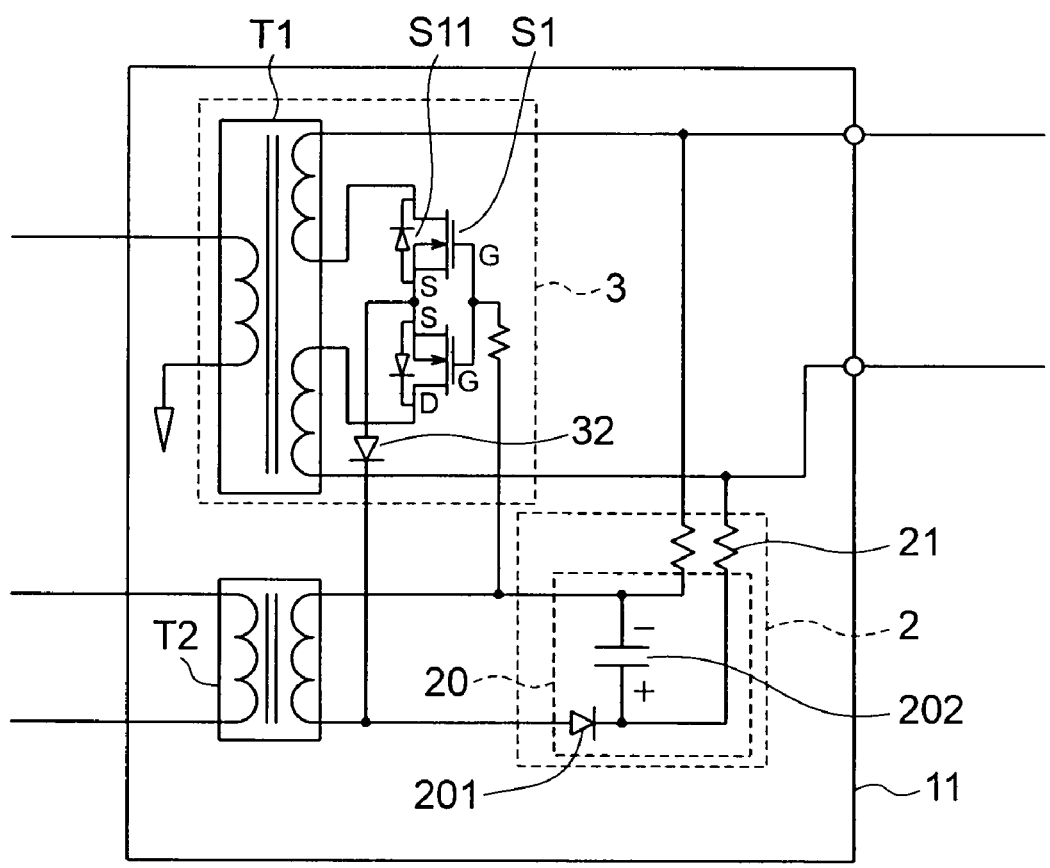
FIG. 3 is a diagram showing a connection example of a rectifying element according to the first embodiment of the present invention.

Alternatively, in FIG. 3, there is shown, as a modification of another rectifying circuit, a connection example in which a cathode terminal of a rectifying element 32 (diode) included in the scanning circuit 3 is connected to the source terminal (high-potential terminal) of the switching element S1. With this configuration, an unnecessary leakage current is not generated, thereby making it possible to operate the function of the disconnection detection.

As described above, according to the present invention, because the second insulation transformer T2 has both functions which are the insulation and transfer of the drive pulse 41 and the power supply pulse 42, there is no need to add a new insulation transformer in order to have a function of the disconnection detection. Therefore, areas to which the components are mounted become smaller and it is possible to obtain the inexpensive analog input device.

In addition, by connecting the anode terminal of the diode serving as the rectifying element 201 or 32 to the high-potential terminal provided on the capacitor 202 of the smoothing circuit 20, an unnecessary leakage current is prevented, thereby making it possible to obtain an appropriate function of the disconnection detection.

Second Embodiment

Figure 4:
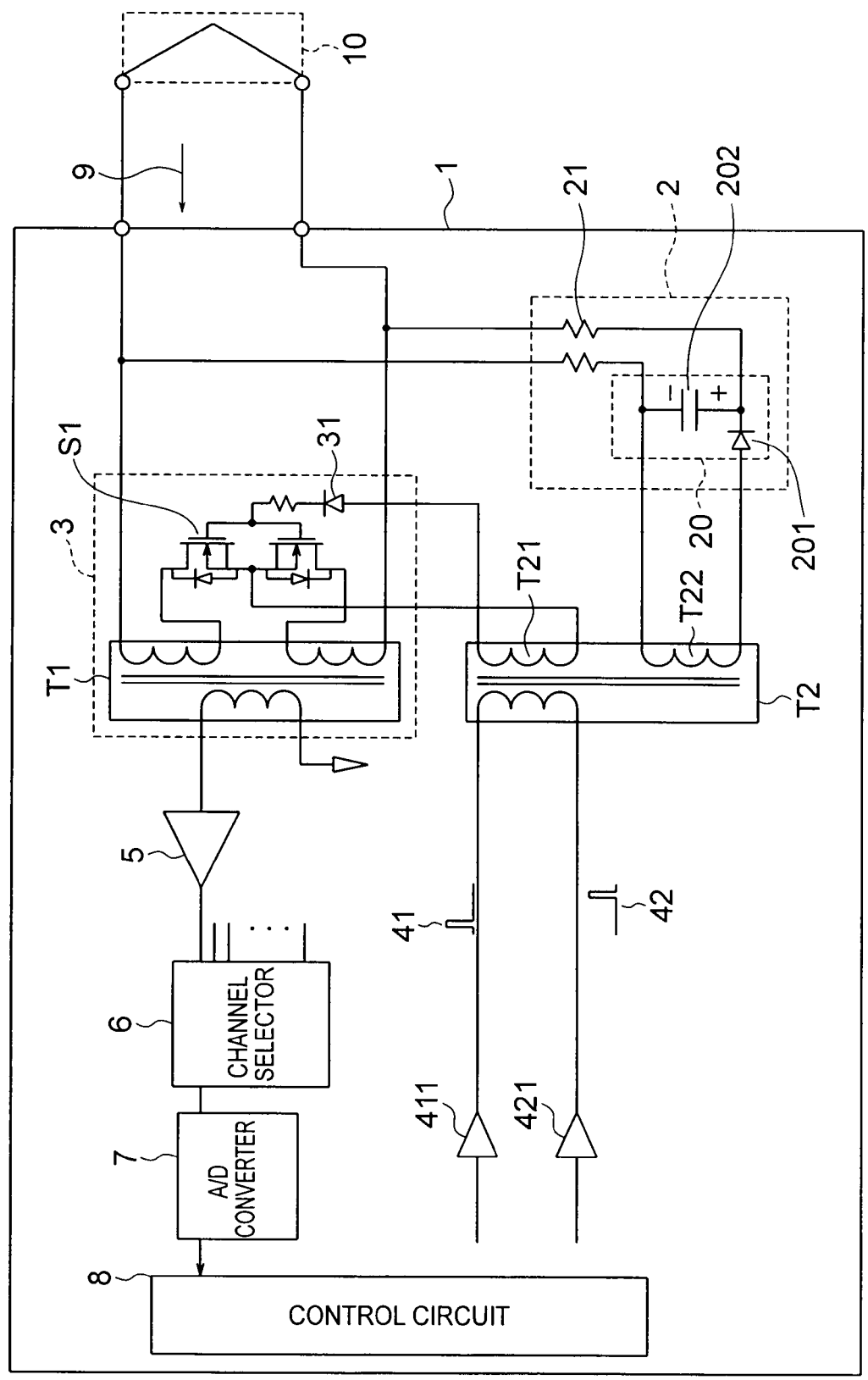
FIG. 4 is a configuration diagram showing a configuration of an analog input device according to a second embodiment of the present invention.

FIG. 4 shows a configuration diagram of an analog input device 1 according to a second embodiment of the present invention. In FIG. 4, the secondary side of the second insulation transformer T2 includes two windings, that is, windings T21 and T22 connected in series. The first winding T21 insulates and transfers the drive pulse 41 for currying out switching of the scanning circuit 3. Also, the second winding T22 insulates and transfers the power supply pulse 42 for currying out feeding of the power supply section 2. Other configurations and operations are similar to those of the first embodiment of the present invention, so the description thereof is omitted here.

As described above, the secondary side of the second insulation transformer T2 includes the two windings, and a circuit for the drive pulse 41 and a circuit for the power supply pulse 42 are separated, so a malfunction of a rectifying function and an unnecessary leakage current are not generated. Accordingly, there can be obtained an inexpensive analog input device having a small circuit structure, in which insulation and transfer of two pulse systems are realized by one insulation transformer component.

As described above, according to this embodiment, the same effect as the first embodiment of the present invention can be obtained. In addition, in this embodiment, the secondary side of the second insulation transformer includes the two windings which are the first winding T21 for insulating and transferring the drive pulse 41 and the second winding T22 for insulating and transferring the power supply pulse 42. Therefore, functional separation of a circuit can be easily performed, thereby obtaining effects in that a malfunction of a rectifying function and an unnecessary leakage current are not generated.

Note that, in the above-mentioned first and second embodiments, there has been described the thermocouple 10 as a sensor which outputs an analog signal. However, the present invention is not limited thereto. The analog input device according to the present invention may be applied to any sensor which outputs an analog signal. Further, as a matter of course, the analog input device according to the present invention may be applied to any device as well as a sensor, which outputs an analog signal.

The invention claimed is:

1. An analog input device to which an analog signal outputted from an external device is inputted, for collecting the analog signal, comprising:
    a scanning circuit which includes a first insulation transformer for insulating the inputted analog signal;
    a power supply section for charging a test voltage used for detecting a disconnection caused in the external device;
    a second insulation transformer in which the scanning circuit and the power supply section are connected with each other in parallel; and
    control means for outputting a pulse signal to be inputted to the second insulation transformer, wherein:
    the second insulation transformer receives a drive pulse for switching the scanning circuit from the control means and insulates the drive pulse to send the drive pulse to the scanning circuit, and also receives a power supply pulse for feeding power to the power supply section from the control means and insulates the power supply pulse to send the power supply pulse to the power supply section; and
    the control means performs a timing control so that the drive pulse and the power supply pulse are not outputted at the same time, and outputs the drive pulse and the power supply pulse therefrom.

2. An analog input device according to claim 1, wherein the power supply section comprises:
    a capacitor for charging the test voltage used for detecting a disconnection caused in the external device; and
    a rectifying element which is put into a conduction state only when the power supply pulse is being outputted from the control means, for supplying the power supply pulse to the capacitor.

3. An analog input device according to claim 2, wherein:
    the rectifying element included in the power supply section comprises a diode; and
    an anode terminal of the diode is connected to a high-potential terminal of the capacitor included in the power supply section.

4. An analog input device according to claim 1, wherein:
    the scanning circuit comprises at least one switching element for switching; and
    the switching element comprises a transistor.

5. An analog input device according to claim 4, wherein the transistor constituting the switching element comprises a field effect transistor.

6. An analog input device according to claim 1, wherein the scanning circuit comprises a rectifying element which is put into a conduction state only when the drive pulse is being outputted from the control means.

7. An analog input device according to claim 6, wherein:
    the rectifying element included in the scanning circuit comprises a diode; and
    a cathode terminal of the diode is connected to a high-potential terminal of the switching element included in the scanning circuit.

8. An analog input device according to claim 1, wherein the second insulation transformer has a secondary side composed of: two windings connected in series, the two windings comprising:
    a first winding for insulating and transferring the drive pulse for switching the scanning circuit; and
    a second winding for insulating and transferring the power supply pulse for feeding power to the power supply section.

* * * * *